United States Patent
Kodama

(10) Patent No.: US 11,929,268 B2
(45) Date of Patent: Mar. 12, 2024

(54) SUBSTRATE PROCESSING SYSTEM, SUBSTRATE PROCESSING METHOD AND COMPUTER-READABLE RECORDING MEDIUM

(71) Applicant: Tokyo Electron Limited, Tokyo (JP)

(72) Inventor: Munehisa Kodama, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 892 days.

(21) Appl. No.: 16/966,909

(22) PCT Filed: Jan. 22, 2019

(86) PCT No.: PCT/JP2019/001836
§ 371 (c)(1),
(2) Date: Aug. 3, 2020

(87) PCT Pub. No.: WO2019/151041
PCT Pub. Date: Aug. 8, 2019

(65) Prior Publication Data
US 2021/0050241 A1    Feb. 18, 2021

(30) Foreign Application Priority Data
Feb. 5, 2018    (JP) .................................. 2018-018370

(51) Int. Cl.
*H01L 21/67*        (2006.01)
*B08B 3/10*         (2006.01)
(Continued)

(52) U.S. Cl.
CPC .......... *H01L 21/67178* (2013.01); *B08B 3/10* (2013.01); *B08B 13/00* (2013.01);
(Continued)

(58) Field of Classification Search
CPC ......... H01L 21/67178; H01L 21/67161; H01L 21/67219; H01L 21/66748;
(Continued)

(56) References Cited

U.S. PATENT DOCUMENTS

2007/0127916 A1* 6/2007 Kitano ................ H01L 21/6715
396/611
2019/0122870 A1* 4/2019 Ishizawa ........... H01J 37/32862

FOREIGN PATENT DOCUMENTS

JP    2004-096089 A    3/2004
JP    2004-154893 A    6/2004
(Continued)

OTHER PUBLICATIONS

International Search Report for PCT/JP2019/001836 dated Mar. 26, 2019, 3 pages.

*Primary Examiner* — Joseph C. Nicely
(74) *Attorney, Agent, or Firm* — Shih IP Law Group, PLLC.

(57) ABSTRACT

A substrate processing system configured to process a substrate includes a carry-in/out unit configured to carry the substrate from/to an outside thereof; a processing unit configured to process a processing surface of the substrate; a cleaning unit provided between the carry-in/out unit and the processing unit when viewed from a top, and configured to clean the processing surface after being processed in the processing unit; a first transfer unit stacked on top of the cleaning unit, and configured to transfer the substrate; and a second transfer unit provided between the processing unit and the first transfer unit when viewed from the top, and configured to transfer the substrate. The first transfer unit transfers the substrate between the carry-in/out unit and the second transfer unit. The second transfer unit transfers the (Continued)

substrate between the first transfer unit and the processing unit and between the processing unit and the cleaning unit.

16 Claims, 8 Drawing Sheets

(51) Int. Cl.
    *B08B 13/00*     (2006.01)
    *B24B 37/10*     (2012.01)
    *H01L 21/304*     (2006.01)
    *H01L 21/677*     (2006.01)
    *H01L 21/687*     (2006.01)

(52) U.S. Cl.
    CPC ............ *B24B 37/10* (2013.01); *H01L 21/304* (2013.01); *H01L 21/67161* (2013.01); *H01L 21/67219* (2013.01); *H01L 21/67748* (2013.01); *H01L 21/68707* (2013.01)

(58) Field of Classification Search
    CPC ..... H01L 21/68707; B08B 13/00; B08B 3/10; B24B 37/10
    See application file for complete search history.

(56) References Cited

FOREIGN PATENT DOCUMENTS

| | | |
|---|---|---|
| JP | 5123329 B | 1/2013 |
| WO | 2017138355 A1 | 8/2017 |

\* cited by examiner

SUBSTRATE PROCESSING SYSTEM, SUBSTRATE PROCESSING METHOD AND COMPUTER-READABLE RECORDING MEDIUM

CROSS-REFERENCE TO RELATED APPLICATION

This application claims the benefit of Japanese Patent Application No. 2018-018370 filed on Feb. 5, 2018, the entire disclosures of which are incorporated herein by reference.

TECHNICAL FIELD

The various aspects and embodiments described herein pertain generally to a substrate processing system configured to process a substrate, a substrate processing method using the substrate processing system, and a computer-readable recording medium therefor.

BACKGROUND

Recently, in a manufacturing process for a semiconductor device, a semiconductor wafer (hereinafter, simply referred to as "wafer") having devices such as a plurality of electronic circuits formed on a front surface thereof is thinned by processing (grinding, polishing, etc.) a rear surface of the wafer.

The processing of the rear surface (processing surface) of the wafer is performed by using a flattening apparatus described in, for example, Patent Document 1. The flattening apparatus is divided into three chambers arranged in sequence from a front side of the flattening apparatus where a load port is provided toward a rear side thereof: a L-shaped wafer (semiconductor substrate) loading/unloading stage chamber; a wafer polishing stage chamber at a middle position; and a wafer grinding stage chamber at an inner side. Within the loading/unloading stage chamber, a first multi-joint substrate transfer robot is provided in a room at the back of the load port, and a substrate cleaning device is provided at the left of this first multi-joint substrate transfer robot. Further, a second transport-type multi-joint substrate transfer robot is provided at an inner side at the rear of the substrate cleaning device. A third multi-joint substrate transfer robot is disposed within the grinding stage chamber. A wafer accommodated in a cassette is transferred into the grinding stage chamber by the first multi-joint substrate transfer robot and the second relaying multi-joint substrate transfer robot and ground therein. Then, the wafer is transferred into the polishing stage chamber by the third multi-joint transfer robot and polished therein. Thereafter, the wafer is then transferred into the substrate cleaning device by the second transport-type multi-joint substrate transfer robot and cleaned therein. Thereafter, the wafer is returned back into the cassette by the first multi-joint substrate transfer robot.

PRIOR ART DOCUMENT

Patent Document 1: Japanese Patent Publication No. 5,123,329

Means for Solving the Problems

In one exemplary embodiment, a substrate processing system configured to process a substrate includes a carry-in/out unit configured to carry the substrate from/to an outside thereof; a processing unit configured to process a processing surface of the substrate; a cleaning unit provided between the carry-in/out unit and the processing unit when viewed from a top, and configured to clean the processing surface of the substrate after being processed in the processing unit; a first transfer unit stacked on top of the cleaning unit, and configured to transfer the substrate; and a second transfer unit provided between the processing unit and the first transfer unit when viewed from the top, and configured to transfer the substrate. The first transfer unit transfers the substrate between the carry-in/out unit and the second transfer unit. The second transfer unit transfers the substrate between the first transfer unit and the processing unit and between the processing unit and the cleaning unit.

In another exemplary embodiment, there is provided a substrate processing method of processing a substrate by using a substrate processing system. The substrate processing system includes a carry-in/out unit configured to carry the substrate from/to an outside thereof; a processing unit configured to process a processing surface of the substrate; a cleaning unit provided between the carry-in/out unit and the processing unit when viewed from a top, and configured to clean the processing surface of the substrate after being processed in the processing unit; a first transfer unit stacked on top of the cleaning unit, and configured to transfer the substrate; and a second transfer unit provided between the processing unit and the first transfer unit when viewed from the top, and configured to transfer the substrate. The substrate processing method includes transferring the substrate from the carry-in/out unit to the first transfer unit; transferring the substrate to the second transfer unit by the first transfer unit; transferring the substrate to the processing unit by the second transfer unit; processing the processing surface of the substrate in the processing unit; transferring the substrate from the processing unit to the cleaning unit by the second transfer unit; cleaning the processing surface of the substrate in the cleaning unit; and transferring the substrate from the cleaning unit to the carry-in/out unit.

In still another exemplary embodiment, there is provided a computer-readable recording medium having stored thereon computer-executable instructions that, in response to execution, cause a substrate processing system to perform a substrate processing method,

DETAILED DESCRIPTION

Figure 1:
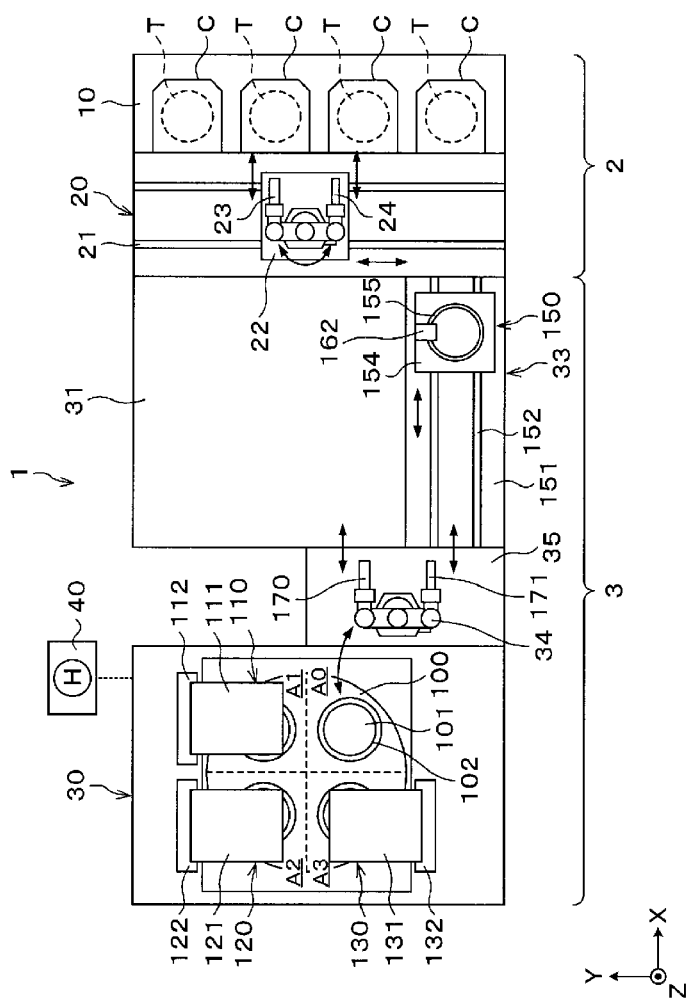
FIG. 1 is a plan view schematically illustrating a configuration of a substrate processing system according to a first exemplary embodiment.

Hereinafter, exemplary embodiments will be described with reference to the accompanying drawings. In the specification and the drawings, parts having substantially same functions and configurations will be assigned same reference numerals, and redundant description thereof will be omitted.

First Exemplary Embodiment

Figure 2:
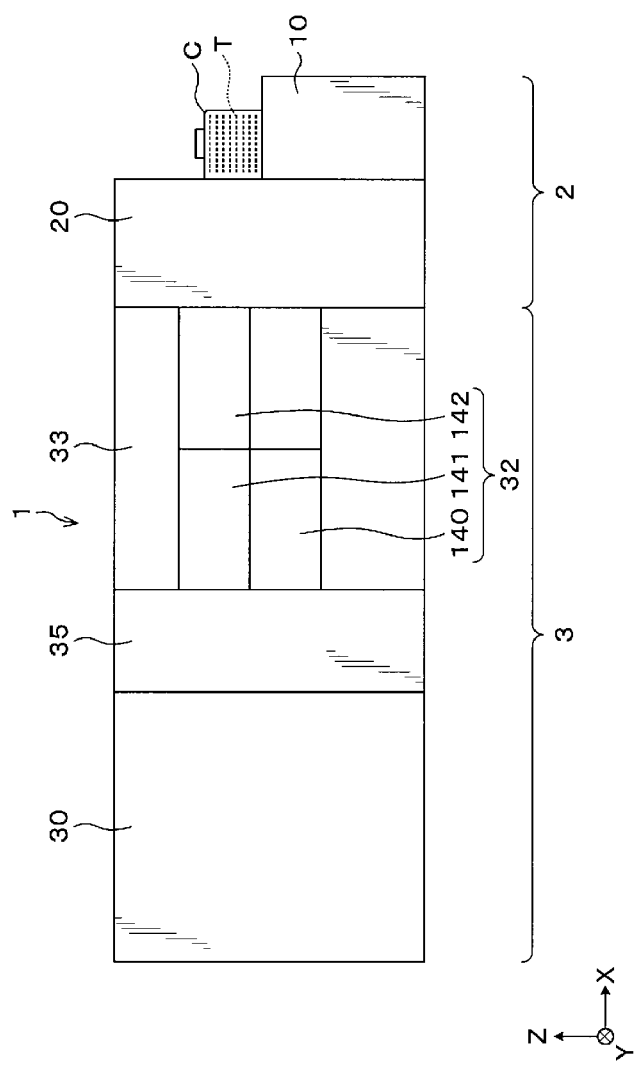
FIG. 2 is a side view schematically illustrating the configuration of the substrate processing system according to the first exemplary embodiment.

First, a configuration of a substrate processing system according to a first exemplary embodiment will be described. FIG. 1 is a plan view schematically illustrating a configuration of a substrate processing system 1 according to the first exemplary embodiment. FIG. 2 is a side view schematically illustrating the configuration of the substrate processing system 1 according to the first exemplary embodiment. Further, in the following, in order to clarify positional relationships, the X-axis, Y-axis and Z-axis which are orthogonal to each other will be defined. The positive Z-axis direction will be regarded as a vertically upward direction.

Figure 3:
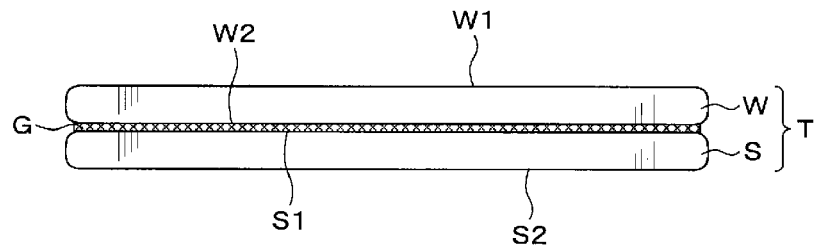
FIG. 3 is a side view illustrating a schematic structure of a combined wafer.

In the substrate processing system 1 according to the present exemplary embodiment, as shown in FIG. 3, a combined wafer T prepared by bonding a processing target wafer W as a substrate and a support wafer S with, for example, an adhesive G therebetween is processed, and the processing target wafer W is thinned. Hereinafter, in the processing target wafer W, a to-be-processed surface (a surface opposite to a surface to which the adhesive G is attached) of the processing target wafer W will be referred to as "processing surface W1," and the surface opposite to the processing surface W1 will be referred to as "non-processing surface W2." Further, in the support wafer S, a surface bonded to the processing target wafer W with the adhesive G therebetween will be referred to as "bonding surface S1," and a surface opposite to the bonding surface S1 will be referred to as "non-bonding surface S2." In the present exemplary embodiment, though the processing target wafer W and the support wafer S are bonded with the adhesive G therebetween, the way to bond them is not limited thereto.

The processing target wafer W is a semiconductor wafer such as, but not limited to, a silicon wafer or a compound semiconductor wafer, and a plurality of devices is formed on the non-processing surface W2.

The support wafer W is a wafer configured to support the processing target wafer W. Further, the support wafer S serves as a protection member which protects the devices on the non-processing surface W2 of the processing target wafer W along with the adhesive G. Further, though the present exemplary embodiment is described for an example where the wafer is used as a support board, any of various other types of substrates such as a glass substrate may be used.

As depicted in FIG. 1, the substrate processing system 1 is equipped with a carry-in/out station 2 in which cassettes C capable of accommodating a multiple number of combined wafers Tare carried to/from the outside as a carry-in/out unit; and a processing station 3 equipped with various kinds of processing apparatuses configured to perform preset processings on the combined wafer T. The carry-in/out station 2 and the processing station 3 are connected as one body.

The carry-in/out station 2 is equipped with a cassette placing table 10. In the shown example, a plurality of, for example, four cassettes C can be arranged in a row in the Y-axis direction on the cassette placing table 10.

In the carry-in/out station 2, a wafer transfer section 20 is provided adjacent to a negative X-axis side of the cassette placing table 10. Provided in the wafer transfer section 20 is a wafer transfer device 22 configured to be movable on a transfer path 21 elongated in the Y-axis direction. The wafer transfer device 22 is equipped with, for example, two transfer arms 23 and 24 configured to hold and transfer the combined wafer T. The first transfer arm 23 has a transfer pad (not shown) configured to attract and hold (vacuum-chuck) the processing surface W1 of the processing target wafer W by evacuation. The second transfer arm 24 has a holding member (not shown) configured to hold (edge-clamp) an end portion of the combined wafer T. The transfer arms 23 and 24 are configured to be movable in a horizontal direction and a vertical direction and pivotable around a horizontal axis and a vertical axis. Further, the configuration of the transfer arms 23 and 24 is not limited to the exemplary embodiment, and various other configurations may be adopted.

The processing station 3 includes a processing apparatus 30 equipped with a grinding unit (processing unit); a CMP (Chemical Mechanical Polishing) apparatus 31 equipped with a polishing unit (processing unit); a cleaning block 32 as a cleaning unit; a shuttle transfer device 33 as a first transfer unit; a wafer transfer device 34 as a second transfer unit; and a transition section 35. The CMP apparatus 31, the cleaning block 32 and the shuttle transfer device 33 are arranged at a positive X-axis side (near the carry-in/out station 2) of the processing station 3. The cleaning block 32 and the shuttle transfer device 33 are stacked in this sequence from the bottom. The CMP apparatus 31 is disposed at a positive Y-axis side of the stacked cleaning block 32 and the shuttle transfer device 33. In the processing station 3, the processing apparatus 30 and the wafer transfer device 34 are disposed at a negative X-axis side (opposite from the carry-in/out station 2). The wafer transfer device 34 is provided in the transition section 35, that is, between the processing apparatus 30 and the CMP apparatus 31, the cleaning block 32 and the shuttle transfer device 33 to deliver the combined wafer T therebetween.

The substrate processing system 1 is equipped with a controller 40. The controller 40 is implemented by, for example, a computer, and includes a program storage (not shown). A program for controlling a processing of the combined wafer T in the substrate processing system 1 is stored in the program storage. Further, the program storage also stores therein a program for implementing a wafer processing to be described later in the substrate processing system 1 by controlling the above-described various processing apparatuses and a driving system such as the transfer devices. Further, the programs may be recorded in a computer-readable recording medium H such as a hard disk (HD), a flexible disk (FD), a compact disk (CD), a magnet optical disk (MO) or a memory card, and may be installed from this recording medium H to the controller 40.

(Processing Apparatus)

The processing apparatus 30 includes a rotary table 100, a rough grinding unit 110, an intermediate grinding unit 120 and a finishing grinding unit 130.

The rotary table 100 is configured to be rotated by a rotating mechanism (not shown). Four chucks 101 configured to attract and hold the combined wafer T are provided on the rotary table 100. The chucks 101 are arranged on a circle concentric with the rotary table 100 at a regular distance therebetween, that is, an angular distance of 90 degrees therebetween. The four chucks 101 are configured to be moved to a delivery position A0 and processing positions A1 to A3 as the rotary table 100 is rotated.

In the present exemplary embodiment, the delivery position A0 is a position at a positive X-axis and negative Y-axis side of the rotary table 100. The first processing position A1 is a position at a positive X-axis and positive Y-axis side of the rotary table 100, and the rough grinding unit 110 is disposed thereat. The second processing position A2 is a position at a negative X-axis and positive Y-axis side of the rotary table 100, and the intermediate grinding unit 120 is disposed thereat. The third processing position A3 is a position at a negative X-axis and negative Y-axis side of the rotary table 100, and the finishing grinding unit 130 is disposed thereat.

Each chuck 101 is held by a chuck base 102. The chuck 101 and the chuck base 102 are configured to be rotated by a rotating device (not shown).

The rough grinding unit 110 is configured to grind the processing surface W1 of the processing target wafer W roughly. The rough grinding unit 110 includes a rough grinder 111 which is equipped with a rough grinding whetstone (not shown) having a ring shape and configured to be rotatable. Further, the rough grinder 111 is configured to be moved in the vertical direction and the horizontal direction along a supporting column 112. By respectively rotating the chuck 101 and the rough grinding whetstone while keeping the processing target wafer W held by the chuck 101 in contact with the rough grinding whetstone, the processing surface W1 of the processing target wafer W is roughly ground.

The intermediate grinding unit 120 is configured to grind the processing surface W1 of the processing target wafer W to a medium level. The intermediate grinding unit 120 includes an intermediate grinder 121 which is equipped with an intermediate grinding whetstone (not shown) having a ring shape and configured to be rotatable. Further, the intermediate grinder 121 is configured to be moved in the vertical direction and the horizontal direction along a supporting column 122. In addition, a particle size of abrasive grains of the intermediate grinding whetstone is smaller than a particle size of abrasive grains of the rough grinding whetstone. By respectively rotating the chuck 101 and the intermediate grinding whetstone while keeping the processing surface W1 of the processing target wafer W held by the chuck 101 in contact with the intermediate grinding whetstone, the processing surface W1 is grinded to the medium level.

The finishing grinding unit 130 is configured to grind the processing surface W1 of the processing target wafer W finely. The finishing grinding unit 130 includes a finishing grinder 131 which is equipped with a finishing grinding whetstone (not shown) configured to be rotated in a ring shape. Further, the finishing grinder 131 is configured to be moved in the vertical direction and the horizontal direction along a supporting column 132. In addition, a particle size of abrasive grains of the finishing grinding whetstone is smaller than the particle size of the abrasive grains of the intermediate grinding whetstone. By respectively rotating the chuck 101 and the finishing grinding whetstone while keeping the processing surface W1 of the processing target wafer W held by the chuck 101 in contact with the finishing grinding whetstone, the processing surface W1 is ground finely.

(CMP Apparatus)

The CMP apparatus 31 includes a delivery unit (not shown) configured to deliver the combined wafer T to/from the wafer transfer device 34; and, for example, two polishing units (not shown) configured to polish the processing surface W1 of the processing target wafer W. A particle size of abrasive grains of the first polishing unit is larger than a particle size of abrasive grains of the second polishing unit. The first polishing unit is configured to polish the processing surface W1 roughly, and the second polishing unit is configured to polish the processing surface W1 finely. Further, the CMP apparatus 31 may have a general configuration for performing a chemical polishing processing. By way of example, in the CMP apparatus 31, the processing target wafer W may be processed in a so-called face-up state in which the processing surface W1 faces up, or in a so-called face-down state in which the processing surface W1 faces down.

(Cleaning Block)

The cleaning block 32 includes a first cleaning apparatus 140 as a first cleaning unit; and a second cleaning apparatus 141 and a third cleaning apparatus 142 as a second cleaning unit. The first cleaning apparatus 140 is provided under the second cleaning apparatus 41 and the third cleaning apparatus 142. The second cleaning apparatus 141 and the third cleaning apparatus 142 are arranged from a negative X-axis side toward a positive X-axis side. By stacking the cleaning apparatuses 140 and 141 (142), a footprint of the substrate processing system 1 can be reduced. Further, as will be described later, the first cleaning apparatus 140 is configured to clean the combined wafer T after being ground, and the second cleaning apparatus 141 and the third cleaning apparatus 142 are configured to clean the combined wafer T after being polished. By stacking the cleaning apparatuses 140 and 141 (142), the cleaning after the grinding is performed at the lower floor, while the cleaning after the polishing is performed at the upper floor. Thus, in the cleaning block 32, the cleanings after the individual processes can be performed at the upper floor and the lower floor in a distributed manner. Furthermore, as will be described later, the wafer transfer device 22 transfers the combined wafer T to the shuttle transfer device 33, and receives the combined wafer T from the third cleaning apparatus 142. Since the third cleaning device 142 is disposed adjacent to the shuttle transfer device 33 in the vertical direction, a movement range of the wafer transfer device 22 in the vertical direction can be reduced.

The first cleaning apparatus 140 is equipped with, for example, a holding member (not shown) configured to hold an end portion of the combined wafer T and a scrub cleaning instrument (not shown). For the combined wafer T held by the holding member, the processing surface W1 of the processing target wafer W and the non-bonding surface S2 of the support wafer S are cleaned by bringing the scrub cleaning instrument into contact with the processing surface W1 and the non-bonding surface S respectively.

The second cleaning apparatus 141 has the same configuration as the first cleaning apparatus 140, and is equipped with, for example, a holding member (not shown) configured to hold the end portion of the combined wafer T and a scrub cleaning instrument (not shown). For the combined wafer T held by the holding member, the processing surface W1 of the processing target wafer W and the non-bonding surface S2 of the support wafer S are cleaned by bringing the scrub cleaning instrument into contact with the processing surface W1 and the non-bonding surface S2 respectively. Moreover, the second cleaning apparatus 141 is further equipped with a transfer device (not shown) configured to transfer the combined wafer T between the second cleaning apparatus 141 and the third cleaning apparatus 142.

The third cleaning apparatus 142 is equipped with, for example, a spin chuck (not shown) configured to hold and rotate the combined wafer T and a nozzle (not shown) configured to supply a cleaning liquid to the processing surface W1 of the processing target wafer W. The third cleaning apparatus 142 supplies the cleaning liquid onto the processing surface W1 of the processing target wafer W while rotating the combined wafer T held by the spin chuck. The supplied cleaning liquid is diffused on the processing surface W1, so that the processing surface W1 is cleaned. By way of example, pure water, hydrogen peroxide, ozone water, an aqueous solution of hydrofluoric acid, a SC1 solution, or the like may be used as the cleaning liquid. Further, the third cleaning apparatus 142 has a carry-in/out opening (not shown) through which the second transfer arm 24 (configured to carry the combined water T out) of the wafer transfer device 22 comes in and out.

Moreover, besides the cleaning apparatus 140 to 142, other cleaning apparatuses may be provided in the cleaning block 32.

(Shuttle Transfer Device)

Figure 4:
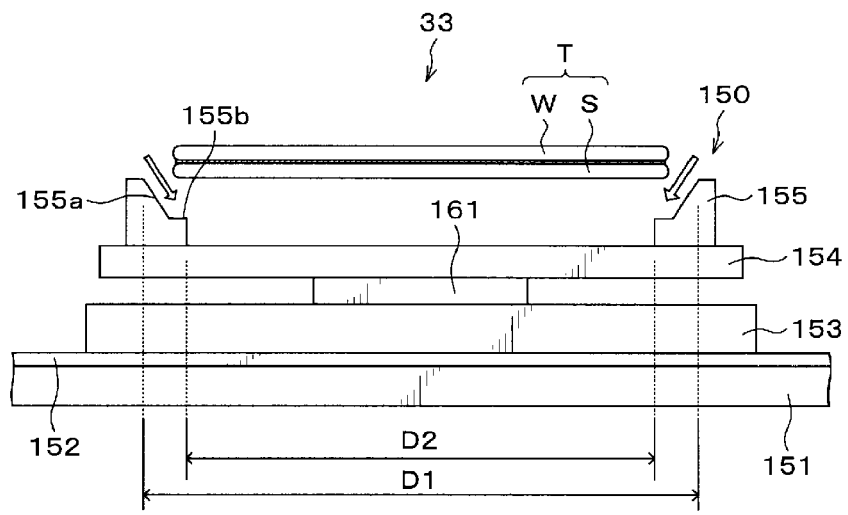
FIG. 4 is a side view illustrating a schematic configuration of a shuttle transfer device.

The shuttle transfer device 33 includes, as depicted in FIG. 1 and FIG. 4, a wafer holder 150 configured to hold the combined wafer T; a transfer path 152 elongated in the X-axis direction on a transfer base 151; and a moving unit 153 configured to move the wafer holder 150 on the transfer path 152. Though the way to drive of the moving unit 153 is not particularly limited, motor driving or linear driving may be used, for example. Further, in the present exemplary embodiment, the transfer path 152 and the moving unit 153 constitute a moving mechanism of the present disclosure.

The wafer holder 150 has a base 154; and a guide 155 provided on the base 154. The guide 155 is formed to have a continuous ring shape, when viewed from the top. When viewed from the side, the guide 155 has a taper portion 155a having a downwardly decreasing diameter; and an end portion 155b formed flat inwardly from a lower end of the taper portion 155a. To elaborate, an inner diameter D1 of an upper end of the taper portion 155a is larger than a diameter of the combined wafer T, and an inner diameter D2 of the lower end of the taper portion 155a is substantially equal to the diameter of the combined wafer T. The combined wafer T is dropped from above the guide 155 and placed on the end portion 155b by being guided along the taper portion 155a. In this way, the combined wafer T is held by the guide 155 while a center position thereof is adjusted by the guide 155 (centering). Moreover, though the guide 155 is formed to have the continuous ring shape in the present exemplary embodiment, the exemplary embodiment is not limited thereto. By way of example, the guide 155 may be formed to have a ring shape in a discontinuous manner, that is, multiple guides may be provided.

Figure 5:
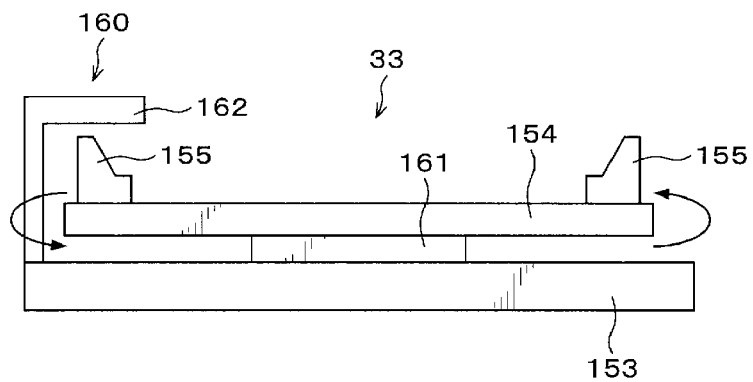
FIG. 5 is a side view illustrating the schematic configuration of the shuttle transfer device.

As illustrated in FIG. 5, the shuttle transfer device 33 may be equipped with an alignment unit 160 configured to adjust a direction of the combined wafer T before being subjected to the grinding in the horizontal direction. In this configuration, a rotating mechanism 161 configured to rotate the wafer holder 150 is provided between the moving unit 153 and the base 154. Further, the alignment unit 160 is equipped with a detector 162 which is provided at the moving unit 153 and configured to detect a notch of the combined wafer T.

The alignment unit 160 adjusts a position of the notch to adjust the direction of the combined wafer T in the horizontal direction by detecting the position of the notch of the combined wafer T with the detector 162 while rotating the combined wafer T by the rotating mechanism 161. The alignment unit 160 may be configured to adjust the direction of the combined wafer T in the horizontal direction while the combined wafer T is being held and transferred by the wafer holder 150. In such a case, a throughput of the wafer processing can be improved.

Figure 6:
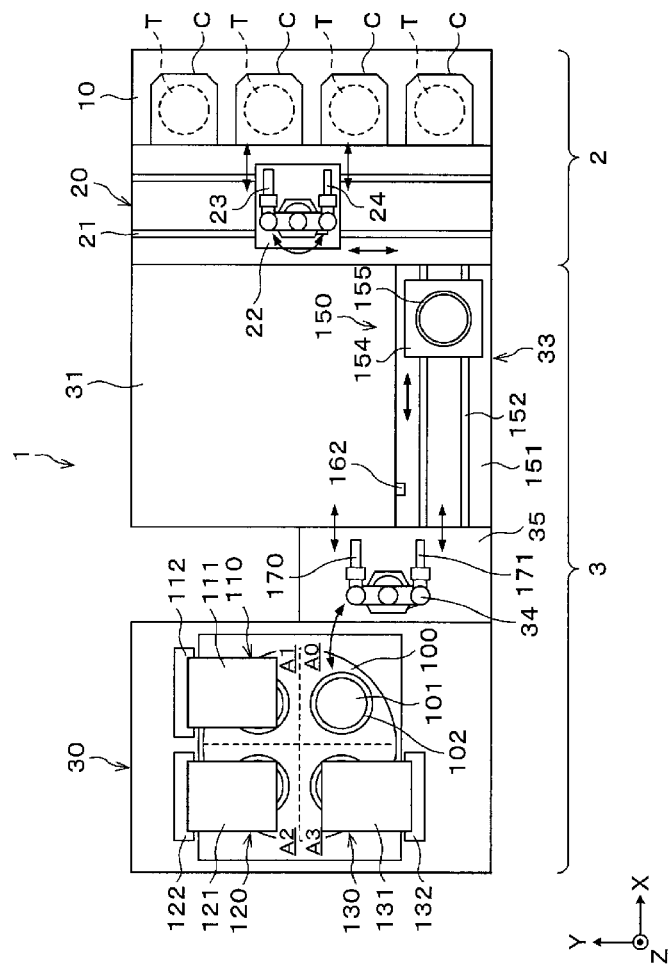
FIG. 6 is a plan view schematically illustrating a configuration of a substrate processing system according to a modification example of the first exemplary embodiment.

Moreover, the alignment unit 160 may have only the detector 162 provided on the transfer base 151, as illustrated in FIG. 6, and the direction of the combined wafer T in the horizontal direction may be adjusted by detecting the notch of the combined wafer W in the state that the wafer holder 150 is stopped.

(Wafer Transfer Device)

The wafer transfer device 34 is equipped with, for example, two transfer arms 170 and 171 configured to hold and transfer the combined wafer T. The first transfer arm 170 includes a transfer pad (not shown) configured to attract and hold (vacuum-chuck) the processing surface W1 of the processing target wafer W by evacuation. The second transfer arm 171 has a holding member (not shown) configured to hold (edge-clamp) an end portion of the combined wafer T. The transfer arms 170 and 171 are configured to be movable in the horizontal direction and the vertical direction and pivotable around the horizontal axis and the vertical axis. The wafer transfer device 34 having this configuration is capable of transferring the combined wafer T to the delivery position A0 of the processing apparatus 30, the shuttle transfer device 33, the first cleaning apparatus 140 and the second cleaning apparatus 141. Furthermore, the configuration of the transfer arms 170 and 171 are not limited to the exemplary embodiment, and various other configurations may be adopted.

(Transition Section)

The wafer transfer device 34 is disposed in the transition section 35, as stated above. The transition section 35 can be removed in, for example, the negative Y-axis direction. Accordingly, maintenance of the processing apparatus 30, the CMP apparatus 31 and the shuttle transfer device 33 can be performed easily. Furthermore, the transition section 35 may be equipped with a drain pan (not shown) configured to receive a liquid falling from the combined wafer T wet with the liquid (wet state) while the combined wafer T is being transferred by the wafer transfer device 34.

Now, a wafer processing performed by using the substrate processing system 1 having the above-described configuration will be explained.

First, a cassette C accommodating therein a plurality of combined wafers T is placed on the cassette placing table 10 of the carry-in/out station 2. Each combined wafer T is accommodated in the cassette C such that the processing surface W1 of the processing target wafer W faces upwards.

Figure 7:
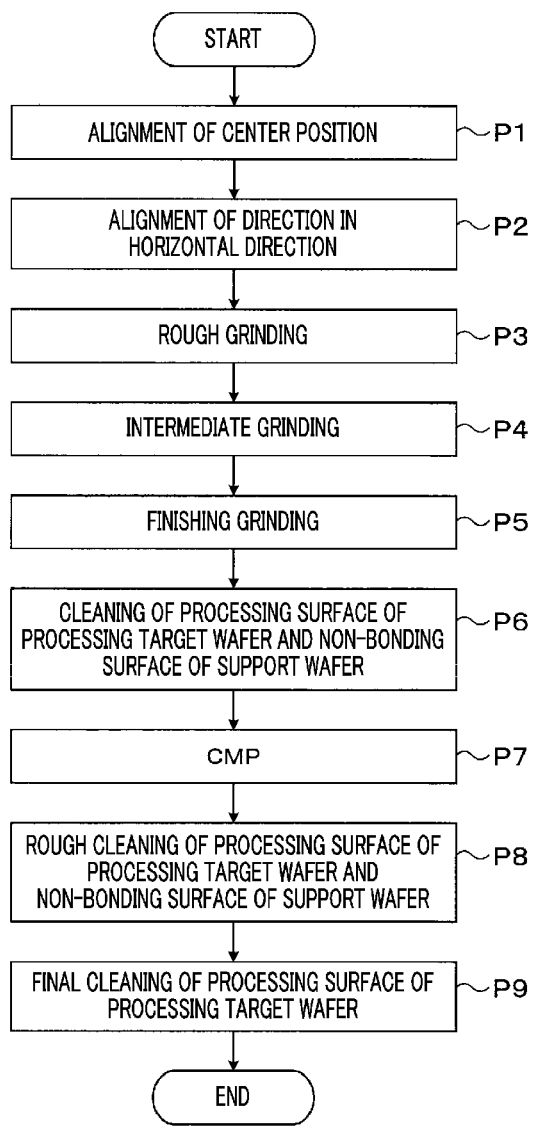
FIG. 7 is a flowchart illustrating major processes of a wafer processing.

Then, the combined wafer T is taken out of the cassette C by the first transfer arm 23 of the wafer transfer device 22, and transferred to the shuttle transfer device 33. At this time, in the shuttle transfer device 33, the wafer holder 150 stands by at the positive X-axis side (near the wafer transfer section 20). Then, the combined wafer T is delivered to the wafer holder 150 from the first transfer arm 23 and held by the guide 155 while a center position thereof is adjusted by the guide 155 (process P1 of FIG. 7).

Thereafter, in the shuttle transfer device 33, the wafer holder 150 holding the combined wafer T is transferred to the negative X-axis side (near the transition section 35) by the moving unit 153. During this transfer of the combined wafer T, a direction of the combined wafer T in the horizontal direction is adjusted by the alignment unit 160 (process P2 of FIG. 7).

Subsequently, the combined wafer T is transferred into the processing apparatus 30 from the shuttle transfer device 33 by the first transfer arm 170 of the wafer transfer device 34. In the processing apparatus 30, the combined wafer T is transferred to the delivery position A0 and delivered onto the chuck 101 at the delivery position A0.

Next, the chuck 101 is moved to the first processing position A1. The processing surface W1 of the processing target wafer W is ground roughly by the rough grinding unit 110 (process P3 of FIG. 7).

Afterwards, the chuck 101 is moved to the second processing position A2. The processing surface W1 of the processing target wafer W is ground to a medium level by the intermediate grinding unit 120 (process P4 of FIG. 7).

Then, the chuck 101 is moved to the third processing position A3. The processing surface W1 of the processing target wafer W is ground finely by the finishing grinding unit 130 (process P5 of FIG. 7).

Subsequently, the chuck 101 is moved to the delivery position A0. Then, the combined wafer T is transferred into the first cleaning apparatus 140 from the delivery position A0 by the first transfer arm 170 of the wafer transfer device 34. Alternatively, this transfer may be carried out by the second transfer arm 171. In the first cleaning apparatus 140, the processing surface W1 of the processing target wafer W and the non-bonding surface S2 of the support wafer S are cleaned by using the scrub cleaning instrument (process P6 of FIG. 7).

Next, the combined wafer T is transferred from the first cleaning apparatus 140 into the CMP apparatus 31 by the second transfer arm 171 of the wafer transfer device 34. In this transfer, if a polishing processing is performed in the CMP apparatus 31 in a face-up state, the combined wafer T is transferred without its front and rear surfaces inverted. If, however, the polishing processing is performed in a face-down state, the front surface and the rear surface of the combined wafer T are inverted. In the CMP apparatus 31, the processing surface W1 of the processing target wafer W is first polished (rough CMP) by the first polishing unit (not shown) and then polished (finishing CMP) by the second polishing unit (not shown) (process P7 of FIG. 7).

Thereafter, the combined wafer T is transferred from the CMP apparatus 31 into the second cleaning apparatus 41 by the second transfer arm 171 of the wafer transfer device 34. In this transfer, if the polishing processing has been performed in the CMP apparatus 31 in the face-up state, the combined wafer T is transferred without its front and rear surfaces inverted. If, however, the polishing processing has been performed in the face-down state, the front surface and the rear surface of the combined wafer T are inverted. Then, in the second cleaning apparatus 141, the processing surface W1 of the processing target wafer W and the non-bonding surface S2 of the support wafer S are cleaned by using the scrub cleaning instrument (process P8 of FIG. 7). The cleaning in this process P8 is rough cleaning for removing particles on the processing surface W1 and the non-bonding surface S2 physically.

Subsequently, the combined wafer T is transferred into the third cleaning apparatus 142 by a transfer device (not shown) of the second cleaning apparatus 141. In the third cleaning apparatus 142, the processing surface W1 of the processing target wafer W is cleaned by using the cleaning liquid supplied from the nozzle (process P9 of FIG. 7). The cleaning in this process P9 is final finishing cleaning. Further, in this process P9, by spinning the combined wafer T, the combined wafer T is dried.

Thereafter, the combined wafer T after being subjected to all the processings required is transferred into the cassette C of the cassette placing table 10 by the second transfer arm 24 of the wafer transfer device 22. Accordingly, a series of processes of the wafer processing in the substrate processing system 1 is completed.

According to the above-described exemplary embodiment, since the single substrate processing system 1 includes the various kinds of processing apparatuses, the series of processings (the grinding processing, the polishing processing, and the cleaning processing) can be appropriately performed on the processing target wafer W.

Further, since the shuttle transfer device 33 is stacked on top of the cleaning block 32, the footprint of the substrate processing system 1 can be reduced. Moreover, by stacking the shuttle transfer device 33 on top of the cleaning block 32, the shuttle transfer device 33 and the cleaning block 32 can be isolated, and the combined wafer T before being ground can be suppressed from being contaminated from a particle from the cleaning block 32 while it is being delivered by the shuttle transfer device 33.

Moreover, in the present exemplary embodiment, though the alignment unit 160 is provided in the shuttle transfer device 33, the alignment unit 160 may be provided within the processing apparatus 30, for example. Here, however, by disposing the alignment unit 160 within the shuttle transfer device 33, the footprint of the substrate processing system 1 can be further reduced.

In addition, in the substrate processing system 1 of the present exemplary embodiment, the grinding processing in the processing apparatus 30 and the polishing processing in the CMP apparatus 31 are performed. However, only the grinding processing may be performed while skipping the polishing processing, or only the cleaning processing may be performed. When only the grinding processing is performed, the combined wafer T after being ground is transferred into the second cleaning apparatus 141 after the processes P1 to P5 are performed, and the processing surface W1 of the processing target wafer W and the non-bonding surface S2 of the support wafer S are cleaned. Thereafter, the combined wafer T is transferred into the third cleaning apparatus 142, and by spinning the combined wafer T, the combined wafer T is dried. Then, the combined wafer T is carried out of the third cleaning apparatus 142 by the second transfer arm 24 of the wafer transfer device 22.

Further, in the substrate processing system 1 according to the present exemplary embodiment, the shuttle transfer device 33 transfers the combined wafer T before being processed toward the processing apparatus 30 from the wafer transfer section 20. However, the combined wafer T in the middle of the processing or after being processed may be transferred into the wafer transfer section 20. By way of example, when the substrate processing system 1 has any trouble, for example, the combined wafer T may be transferred into the wafer transfer section 20 by the shuttle transfer device 33 and collected back into the cassette C.

Figure 8:
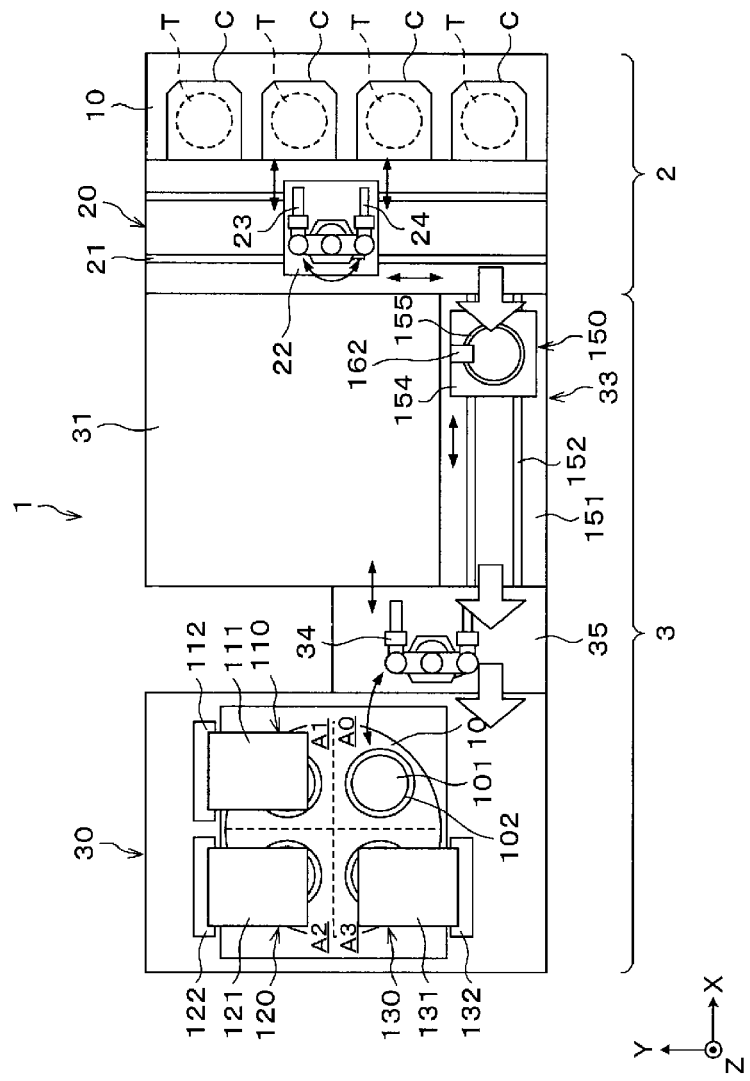
FIG. 8 is an explanatory diagram illustrating an air current formed within the substrate processing system.

Now, an air current formed within the substrate processing system 1 when the wafer processing is performed in the substrate processing system 1 having the above-described configuration will be explained with reference to FIG. 8. Further, arrows in FIG. 8 indicate a direction of the air current.

In the substrate processing system 1, a pressure within the wafer transfer section 20 of the carry-in/out station 2 is the highest, and a pressure within the processing apparatus 30 is the lowest. The pressure within the wafer transfer section 20, a pressure within the shuttle transfer device 33, a pressure within the transition section 35, and the pressure within the processing apparatus 30 are set to decrease in this sequence. Furthermore, a carry-in/out opening (not shown) through which the combined wafer T is carried in and out is provided at a side surface of the processing apparatus 30 near the transition section 35, and an opening/closing shutter (not shown) is provided at this carry-in/out opening.

In this case, an air current flowing toward the transition section 35 from the wafer transfer section 20 via the shuttle transfer device 33 is formed. Further, if the opening/closing shutter of the processing apparatus 30 is opened, an air current flowing toward the processing apparatus 30 from the transition section 35 is formed. Thus, for example, a particle (for example, a polishing residue) generated within the processing apparatus 30 can be suppressed from being introduced into the wafer transfer section 20. Furthermore, since the shuttle transfer device 33 is provided between the processing apparatus 30 and the wafer transfer section 20, this shuttle transfer device 33 serves to break the flow of the air current between the processing apparatus 30 and the wafer transfer section 20, and the introduction of the particle into the wafer transfer section 20 can be further suppressed. As a result, adhesion of the particle to the combined wafer T (processing target wafer W) within the wafer transfer section 20 can be suppressed. Particularly, since adhesion of the particle to the combined wafer T after being subjected to all the processings required can be suppressed, a product yield can be improved.

Furthermore, in each apparatus (wafer transfer section 20, the processing apparatus 30, the CMP apparatus 31, the cleaning apparatuses 141 to 143, the shuttle transfer device 33, and the transition section 35) of the substrate processing system 1, a FFU (Fan Filter Unit), for example, is provided at an upper portion, and an exhaust device is provided at a lower portion. With this configuration, a descending air current (downflow) is formed within each of the apparatuses, so that an internal atmosphere is cleaned. Furthermore, by adjust a pressure within each apparatus with this configuration, the aforementioned pressure condition within the substrate processing system 1 can be achieved.

Second Exemplary Embodiment

Figure 9:
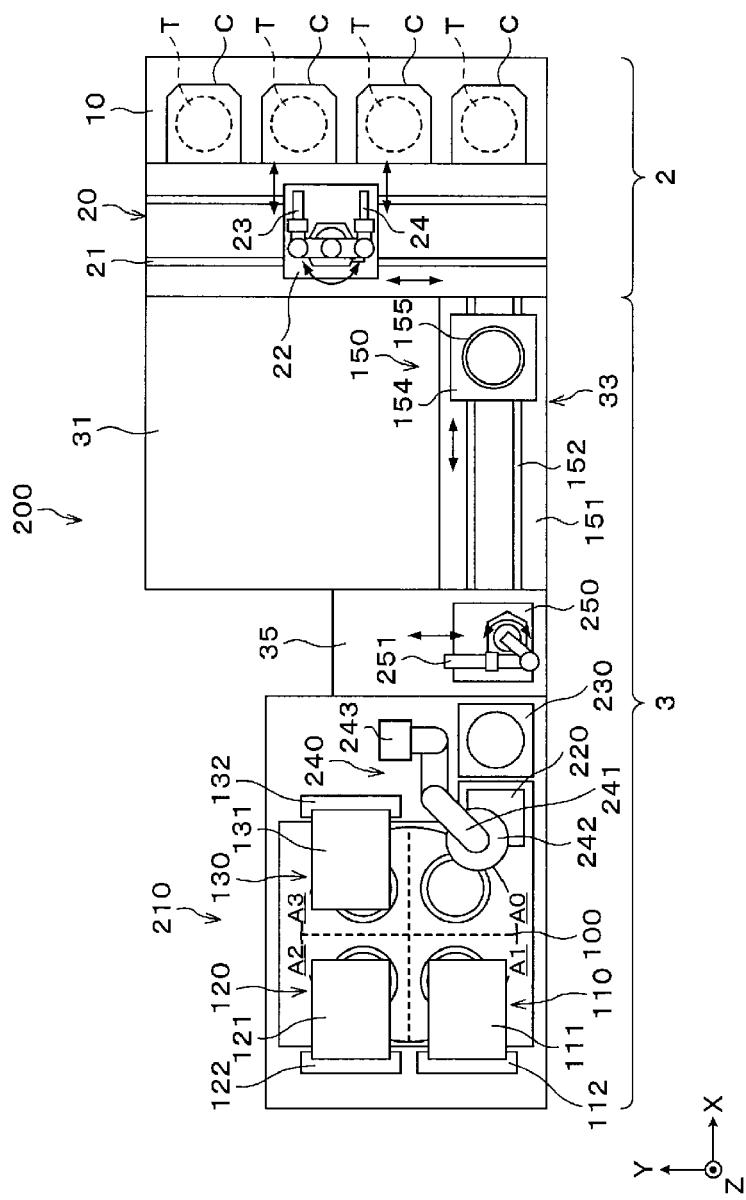
FIG. 9 is a plan view schematically illustrating a configuration of a substrate processing system according to a second exemplary embodiment.
Figure 10:
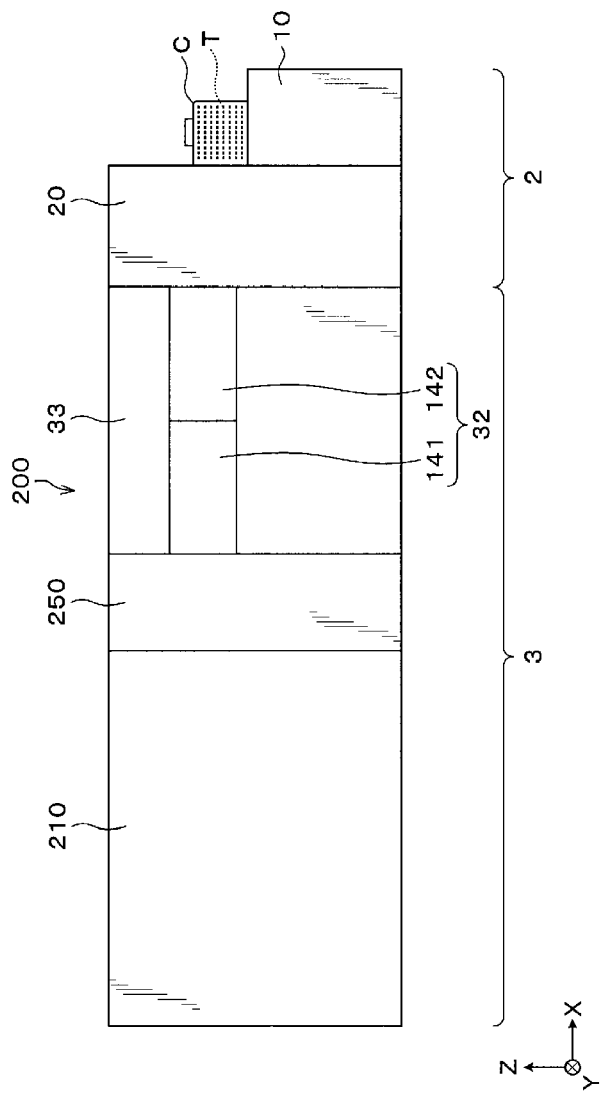
FIG. 10 is a side view schematically illustrating the configuration of the substrate processing system according to the second exemplary embodiment.

Now, a configuration of a substrate processing system according to a second exemplary embodiment of the present disclosure will be discussed. FIG. 9 is a plan view schematically illustrating a configuration of a substrate processing system 200 according to the second exemplary embodiment. FIG. 10 is a side view schematically illustrating a configuration of the substrate processing system 200 according to the second exemplary embodiment. The following description will focus on distinctive features of the second exemplary embodiment from the first exemplary embodiment, and same parts in both exemplary embodiments will be assigned same reference numerals.

The substrate processing system 200 according to the second exemplary embodiment includes a processing apparatus 210 and a wafer transfer device 250 instead of the processing apparatus 30 and the wafer transfer device 34 of the substrate processing system 1 of the first exemplary embodiment. The processing apparatus 210 is prepared by rotating the processing apparatus 30 by 90 degrees in the counterclockwise direction, when viewed from the top. The wafer transfer device 250 is provided in the transition section 35 and located between the processing apparatus 210 and the shuttle transfer device 33 when viewed from the top. That is, the processing apparatus 210, the wafer transfer device 250 and the shuttle transfer device 33 are arranged in this sequence from a negative X-axis side toward a positive X-axis side.

The processing apparatus 210 incorporates therein a cleaning unit 220 as an additional cleaning unit, an alignment unit 230 and a transfer unit 240 as a third transfer unit in addition to a rotary table 100, a rough grinding unit 110, an intermediate grinding unit 120 and a finishing grinding unit 130 which are the same as those of the processing apparatus 30. The cleaning unit 220, the alignment unit 230 and the transfer unit 240 are respectively arranged at a positive X-axis side of a delivery position A0.

The cleaning unit 220 is configured to clean the combined wafer T after grinding. The cleaning unit 220 has the same configuration as that of the first cleaning apparatus 140 provided in the cleaning block 32 of the substrate processing system 1 of the first exemplary embodiment. Additionally, the first cleaning apparatus 140 is omitted, and only a second cleaning apparatus 141 and a third cleaning apparatus 142 are provided in a cleaning block 32 of the substrate processing system 200.

The alignment unit 230 is configured to adjust a direction of the combined wafer T before being subjected to the grinding in a horizontal direction.

The transfer unit 240 is a multi-joint robot equipped with a plurality of, for example, three arms 241. Each of the three arms 241 is configured to be rotatable. The arm 241 at a leading end is provided with a transfer pad 242 configured to attract and hold the combined wafer T. Further, the arm 241 at a base end is mounted to a vertical moving mechanism 243 configured to move the arm 241 in a vertical direction. The transfer unit 240 having this configuration is capable of transferring the combined wafer T to/from the delivery position A0, the cleaning unit 220 and the alignment unit 230.

The wafer transfer device 250 is equipped with, for example, one transfer arm 251 configured to hold and transfer the combined wafer T. Two picks (not shown) are provided at a leading end of the transfer arm 251. The first pick has a transfer pad (not shown) configured to attract and hold (vacuum-chuck) the processing surface W1 of the processing target wafer W by evacuation. The second pick has a holding member (not shown) configured to hold (edge-clamp) an end portion of the combined wafer T. The transfer arm 251 is configured to be movable in the horizontal direction and the vertical direction and pivotable around a horizontal axis and a vertical axis. The wafer transfer device 250 having this configuration is capable of transferring the combined wafer T to/from the alignment unit 230 of the processing apparatus 210, the CMP apparatus 31, the shuttle transfer device 33 and the second cleaning device 141. The configuration of the transfer arm 251 is not limited to the exemplary embodiment, and various other configurations may be adopted.

Further, the other configurations of the substrate processing system 200 are the same as those of the substrate processing system 1.

In the substrate processing system 200 having the above-described configuration, the same processings performed in the processes P1 to P9 in the substrate processing system 1 are conducted. The same effect as obtained in the first exemplary embodiment can be also achieved by the second exemplary embodiment.

Further, though the single shuttle transfer device 33 is stacked on top of the cleaning block 32 in the substrate processing systems 1 and 200 according to the above-described exemplary embodiments, the shuttle transfer device 33 may be plural in number, and these shuttle transfer devices 33 may be stacked in multiple levels.

Furthermore, in the substrate processing systems 1 and 200 according to the above-described exemplary embodiments, the adhesive G and the support wafer S are used as the protection member for protecting the devices on the non-processing surface W2 of the processing target wafer W. However, the protection member for the devices may not be limited thereto. By way of non-limiting example, a protection tape may be attached to the non-processing surface W2 of the processing target wafer W to protect the devices thereon.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

EXPLANATION OF CODES

According to the exemplary embodiments, the substrate processing system is equipped with the processing unit and the cleaning unit required for processing the substrate, and is capable of performing the processing on the substrate appropriately. Further, since the first transfer unit is stacked on top of the cleaning unit, the footprint of the substrate processing system can be reduced.

I claim:

1. A substrate processing system configured to process a substrate, comprising:
a carry-in/out unit configured to carry the substrate from/to an outside thereof;
a processing unit configured to process a processing surface of the substrate;
a cleaning unit provided between the carry-in/out unit and the processing unit when viewed from a top, and configured to clean the processing surface of the substrate after being processed in the processing unit;
a first transfer unit stacked on top of the cleaning unit, and configured to transfer the substrate; and
a second transfer unit provided between the processing unit and the first transfer unit when viewed from the top, and configured to transfer the substrate,
wherein the first transfer unit transfers the substrate between the carry-in/out unit and the second transfer unit, and
the second transfer unit transfers the substrate between the first transfer unit and the processing unit and between the processing unit and the cleaning unit.

2. The substrate processing system of claim 1,
wherein the first transfer unit comprises:
a substrate holder configured to hold the substrate and provided with a guide, which is provided in a ring shape continuously or discontinuously when viewed from the top and has a taper shape with a downwardly decreasing diameter when viewed from a side; and
a moving mechanism configured to move the substrate holder.

3. The substrate processing system of claim 1,
wherein the first transfer unit comprises:
a substrate holder configured to hold the substrate;
a moving mechanism configured to move the substrate holder; and
a rotating mechanism configured to rotate the substrate holder.

4. The substrate processing system of claim 1,
wherein the processing unit comprises:
a grinding unit configured to grind the processing surface of the substrate; and
a polishing unit configured to polish the processing surface of the substrate after being ground in the grinding unit, and
wherein the polishing unit, and the cleaning unit and the first transfer unit, which are stacked on top of each other, are arranged between the carry-in/out unit and the grinding unit when viewed from the top.

5. The substrate processing system of claim 4,
wherein the cleaning unit comprises:
a first cleaning unit configured to clean the processing surface of the substrate after being ground in the grinding unit; and
a second cleaning unit configured to clean the processing surface of the substrate after being polished in the polishing unit.

6. The substrate processing system of claim 5,
wherein the first cleaning unit and the second cleaning unit are stacked.

7. The substrate processing system of claim 4,
wherein the cleaning unit is configured to clean the processing surface of the substrate after being polished in the polishing unit,
the substrate processing system further comprises an additional cleaning unit configured to clean the processing surface of the substrate after being ground in the grinding unit, and
the grinding unit and the additional cleaning unit are provided in a same device.

8. The substrate processing system of claim 7, further comprising:
a third transfer unit configured to transfer the substrate to/from the grinding unit and the additional cleaning unit.

9. The substrate processing system of claim 4,
wherein the first transfer unit comprises:
a substrate holder configured to hold the substrate;
a moving mechanism configured to move the substrate holder;
a rotating mechanism configured to rotate the substrate holder; and
a detector configured to detect a notch of the substrate.

10. The substrate processing system of claim 4,
wherein the substrate is a combined wafer in which a support wafer and a processing target wafer having a device formed on a non-processing surface thereof are bonded with each other,
the grinding unit is configured to grind the processing surface on which no device is formed, and
the polishing unit is configured to polish the processing surface on which no device is formed.

11. The substrate processing system of claim 1,
wherein the substrate is a combined wafer in which a support wafer and a processing target wafer having a device formed on a non-processing surface thereof are bonded with each other,
the processing unit is configured to process the processing surface on which no device is formed, and
the cleaning unit is configured to clean the processing surface on which no device is formed.

12. The substrate processing system of claim 1,
wherein a pressure within the carry-in/out unit, a pressure within the first transfer unit and a pressure within the processing unit are set to decrease in this order.

13. A substrate processing method of processing a substrate by using a substrate processing system,
wherein the substrate processing system comprises:
a carry-in/out unit configured to carry the substrate from/to an outside thereof;
a processing unit configured to process a processing surface of the substrate;
a cleaning unit provided between the carry-in/out unit and the processing unit when viewed from a top, and configured to clean the processing surface of the substrate after being processed in the processing unit;
a first transfer unit stacked on top of the cleaning unit, and configured to transfer the substrate; and
a second transfer unit provided between the processing unit and the first transfer unit when viewed from the top, and configured to transfer the substrate, and
wherein the substrate processing method comprises:
transferring the substrate from the carry-in/out unit to the first transfer unit;
transferring the substrate to the second transfer unit by the first transfer unit;
transferring the substrate to the processing unit by the second transfer unit;
processing the processing surface of the substrate in the processing unit;
transferring the substrate from the processing unit to the cleaning unit by the second transfer unit;
cleaning the processing surface of the substrate in the cleaning unit; and
transferring the substrate from the cleaning unit to the carry-in/out unit.

14. The substrate processing method of claim 13,
wherein the first transfer unit comprises:
a substrate holder configured to hold the substrate;
a moving mechanism configured to move the substrate holder;
a rotating mechanism configured to rotate the substrate holder; and
a detector configured to detect a notch of the substrate, and
wherein the first transfer unit adjusts a position of the notch between the transferring of the substrate from the carry-in/out unit to the first transfer unit and the transferring of the substrate to the processing unit by the second transfer unit.

15. The substrate processing method of claim 13,
wherein the substrate is a combined wafer in which a support wafer and a processing target wafer having a device formed on a non-processing surface thereof are bonded with each other,
the processing unit is configured to process the processing surface on which no device is formed, and
the cleaning unit is configured to clean the processing surface on which no device is formed.

16. A non-transitory computer-readable recording medium having stored thereon computer-executable instructions that, in response to execution, cause a substrate processing system to perform a substrate processing method,
wherein the substrate processing system comprises:
a carry-in/out unit configured to carry a substrate from/to an outside thereof;
a processing unit configured to process a processing surface of the substrate;
a cleaning unit provided between the carry-in/out unit and the processing unit when viewed from a top, and configured to clean the processing surface of the substrate after being processed in the processing unit;
a first transfer unit stacked on top of the cleaning unit, and configured to transfer the substrate; and
a second transfer unit provided between the processing unit and the first transfer unit when viewed from the top, and configured to transfer the substrate, and
wherein the substrate processing method comprises:
transferring the substrate from the carry-in/out unit to the first transfer unit;
transferring the substrate to the second transfer unit by the first transfer unit;
transferring the substrate to the processing unit by the second transfer unit;
processing the processing surface of the substrate in the processing unit;
transferring the substrate from the processing unit to the cleaning unit by the second transfer unit;
cleaning the processing surface of the substrate in the cleaning unit; and
transferring the substrate from the cleaning unit to the carry-in/out unit.

* * * * *